United States Patent
Miura et al.

(10) Patent No.: US 10,603,912 B2
(45) Date of Patent: Mar. 31, 2020

(54) ELEMENT BOARD, LIQUID EJECTION HEAD, AND PRINTING APPARATUS

(71) Applicant: CANON KABUSHIKI KAISHA, Tokyo (JP)

(72) Inventors: Yosuke Miura, Tokyo (JP); Kengo Umeda, Tokyo (JP); Takaaki Yamaguchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/016,761

(22) Filed: Jun. 25, 2018

(65) Prior Publication Data
US 2019/0001680 A1 Jan. 3, 2019

(30) Foreign Application Priority Data
Jun. 30, 2017 (JP) ................. 2017-129196

(51) Int. Cl.
*B41J 2/14* (2006.01)
*H05K 1/11* (2006.01)
*H05K 1/02* (2006.01)

(52) U.S. Cl.
CPC ....... *B41J 2/14129* (2013.01); *B41J 2/14072* (2013.01); *H05K 1/0212* (2013.01); *H05K 1/111* (2013.01); *B41J 2002/14491* (2013.01); *B41J 2202/13* (2013.01); *B41J 2202/18* (2013.01); *B41J 2202/20* (2013.01); *H05K 2201/09027* (2013.01); *H05K 2201/09409* (2013.01)

(58) Field of Classification Search
CPC ............... B41J 2/14129; B41J 2/14072; B41J 2/17526; B41J 2002/14491
See application file for complete search history.

(56) References Cited

U.S. PATENT DOCUMENTS

| | | | |
|---|---|---|---|
| 7,441,877 B2 | 10/2008 | Kubo et al. | |
| 8,070,263 B2 | 12/2011 | Oohashi et al. | |
| 2006/0125881 A1 | 6/2006 | Kubo et al. | |
| 2007/0222837 A1* | 9/2007 | Tajima | B41J 2/175 |
| 2016/0193837 A1* | 7/2016 | Kudo et al. | B41J 2/14088 |
| 2017/0282554 A1* | 10/2017 | Kato et al. | B41J 2/1433 |

FOREIGN PATENT DOCUMENTS

JP 2006-168179 A 6/2006

OTHER PUBLICATIONS

Pending U.S. Appl. No. 16/009,808, filed Jun. 15, 2018 (available on USPTO system).

* cited by examiner

*Primary Examiner* — Juanita D Jackson
(74) *Attorney, Agent, or Firm* — Venable LLP

(57) ABSTRACT

There are provided an element board, a liquid ejection head, and a printing apparatus capable of suppressing decrease of the durability of the heating resistor elements. For that purpose, a group of driving electrode pads is shifted from the center of a column of electrode pads toward the side where a heating resistor element located farthest from the group of driving electrode pads exists.

18 Claims, 8 Drawing Sheets

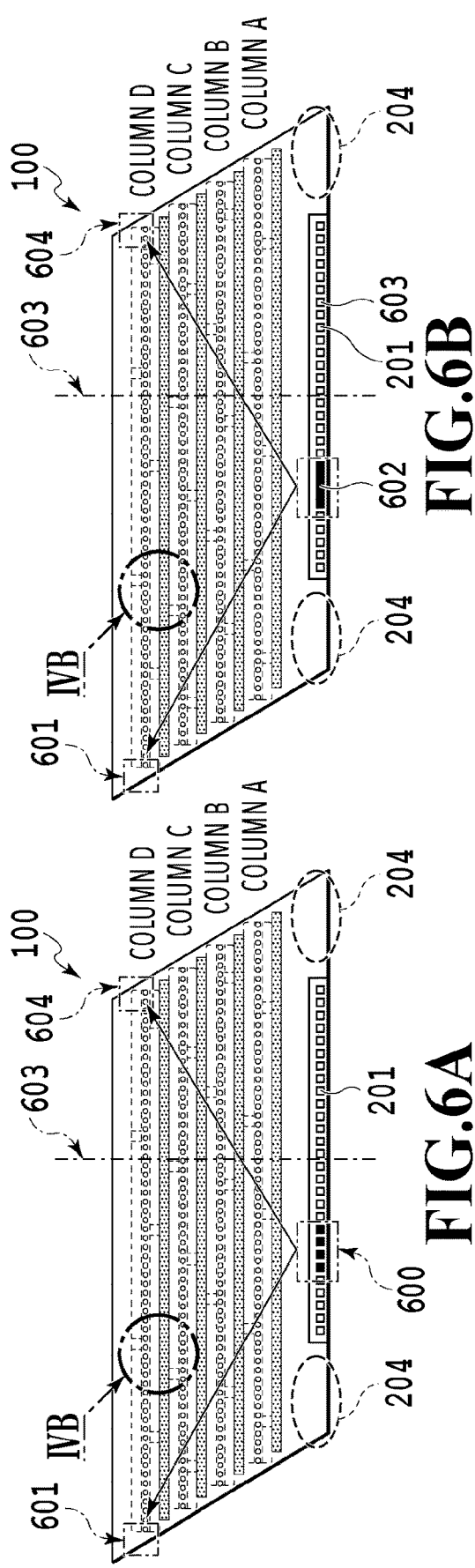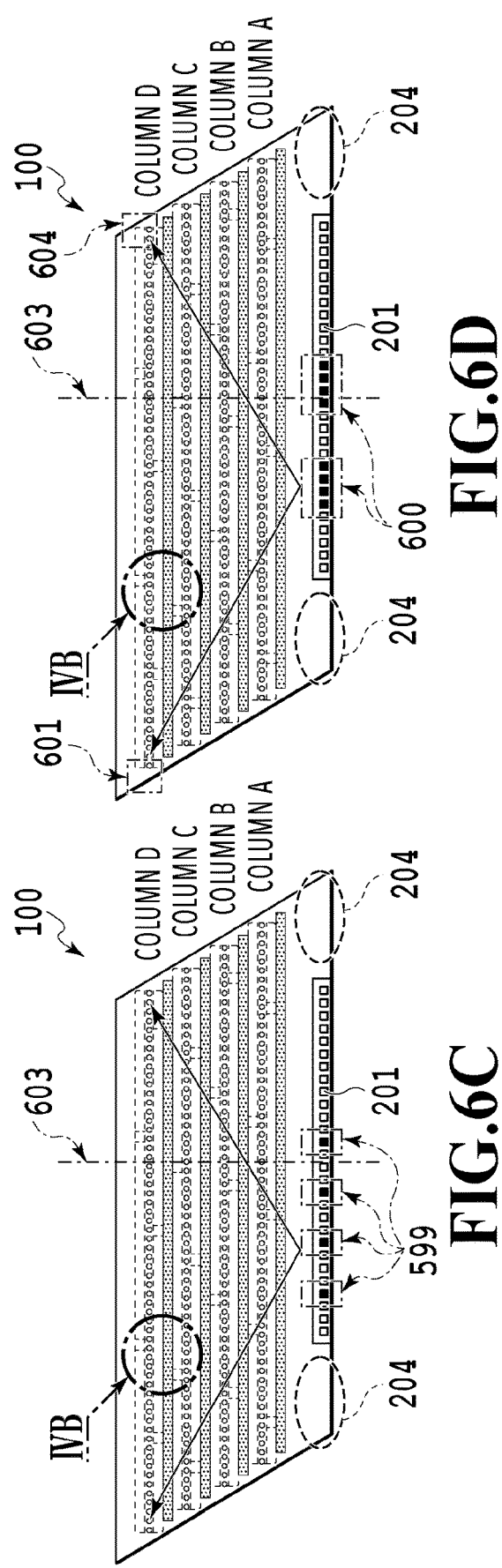

ELEMENT BOARD, LIQUID EJECTION HEAD, AND PRINTING APPARATUS

BACKGROUND OF THE INVENTION

Field of the Invention

The present invention relates to an element board having a plurality of heating resistor elements and a driving circuit configured to drive the heating resistor elements provided thereon, a liquid ejection head having the element board mounted thereon, and a printing apparatus.

Description of the Related Art

With the advent of faster and higher-resolution printing in recent years, there is a trend of increase in the number of the heating resistor elements installed in liquid ejection heads. Accordingly, it has become important to suppress increase of the area of the element board on which circuits are installed to drive heating resistor elements, and optimize the arrangement and the wiring layout of heating resistor elements in the case where the element board has the shape of a parallelogram or a trapezoid. An increased area of the element board results in a longer distance from the electrode terminals to the heating resistor elements for supplying electric current to the heating resistor elements, and a larger value of voltage drop that occurs due to the wiring resistance from the electrode terminals to the heating resistor elements. Accordingly, to stably drive the heating resistor elements, a value of voltage drop is preliminarily predicted and a compensation is made by adding the predicted value.

Japanese Patent Laid-Open No. 2006-168179 describes a method of suppressing, to a minimum, the number of electrode terminals supplying electric current to heating resistor elements and suppressing increase of the board size by connecting the drive wiring for driving the heating resistor elements in common to all the heating resistor elements.

Connecting the drive wiring in common to all heating resistor elements as described in Japanese Patent Laid-Open No. 2006-168179 results in that the voltage drop which occurs when heating resistor elements are driven becomes largest in the heating resistor element located farthest from the electrode terminals, and smallest in the heating resistor element located closest from the electrode terminals. In the case where the voltage drop that occurs significantly differs depending on the position of heating resistor elements as described above, a compensated amount corresponding to the voltage drop in the heating resistor element located farthest from the electrode terminals is supplied to all heating resistor elements. In that case, however, there is a risk of over-supply to the heating resistor element located closest from the electrode terminals, which may result in a significant decrease of the durability of the heating resistor elements.

SUMMARY OF THE INVENTION

The present invention therefore provides an element board, a liquid ejection head, and a printing apparatus capable of suppressing decrease of the durability of the heating resistor elements.

An element board of the present invention having a surface includes a plurality of ejection elements to be used to eject liquid from ejection ports; and a column of electrode terminals provided in proximity to a predetermined edge and having a plurality of electrode terminals arranged along the edge, the column of electrode terminals including at least one group of power source terminals having a plurality of power source terminals provided adjacent to each other along the edge and connected to the plurality of ejection elements to supply electric current to the ejection elements, wherein the surface has a first region and a second region divided by a perpendicular bisector of the column of electrode terminals, the plurality of ejection elements in the first region include a first ejection element located farthest from an intersection of the column of electrode terminals and the perpendicular bisector, the plurality of ejection elements in the second region include a second ejection element located farthest from the intersection, a distance from the intersection to the first ejection element is longer than a distance from the intersection to the second ejection element, and the at least one group of power source terminals is provided closer to the first region than to the second region.

According to the present invention, it is possible to realize an element board, a liquid ejection head, and a printing apparatus capable of suppressing decrease of the durability of heating resistor elements.

Further features of the present invention will become apparent from the following description of exemplary embodiments with reference to the attached drawings.

BRIEF DESCRIPTION OF THE DRAWINGS

FIG. 6A illustrates the element board;

FIG. 6B illustrates the element board;

FIG. 6C illustrates the element board;

FIG. 6D illustrates the element board;

DESCRIPTION OF THE EMBODIMENTS

First Embodiment

Figure 1:
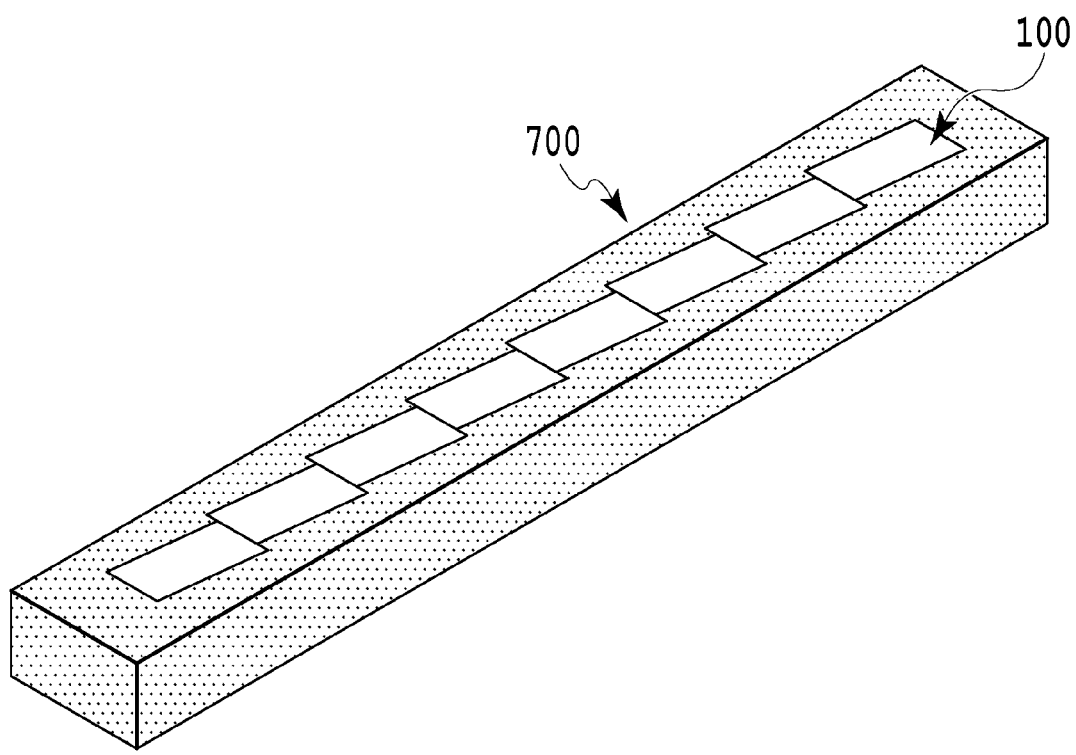
FIG. 1 is a perspective view illustrating a liquid ejection head having mounted thereon a plurality of element boards.

In the following, a first embodiment of the present invention will be described, referring to the drawings.

FIG. 1 is a perspective view illustrating a liquid ejection head 700 having mounted thereon a plurality of element boards 100 according to the present embodiment. Each of the element boards 100 has a plurality of ejection ports capable of ejecting liquid arranged in a column, and heating resistor elements (ejection elements, heaters) provided so as to face the ejection ports. Liquid is ejected from the ejection ports by action of the heating resistor elements. A printing apparatus, having the liquid ejection head 700 and a transportation unit configured to transport a print medium that receives liquid ejected from the liquid ejection head 700, is configured to perform printing on the print medium. Note that, although there are eight of the element boards 100 provided in FIG. 1, the number is not limited thereto.

Figure 2A:
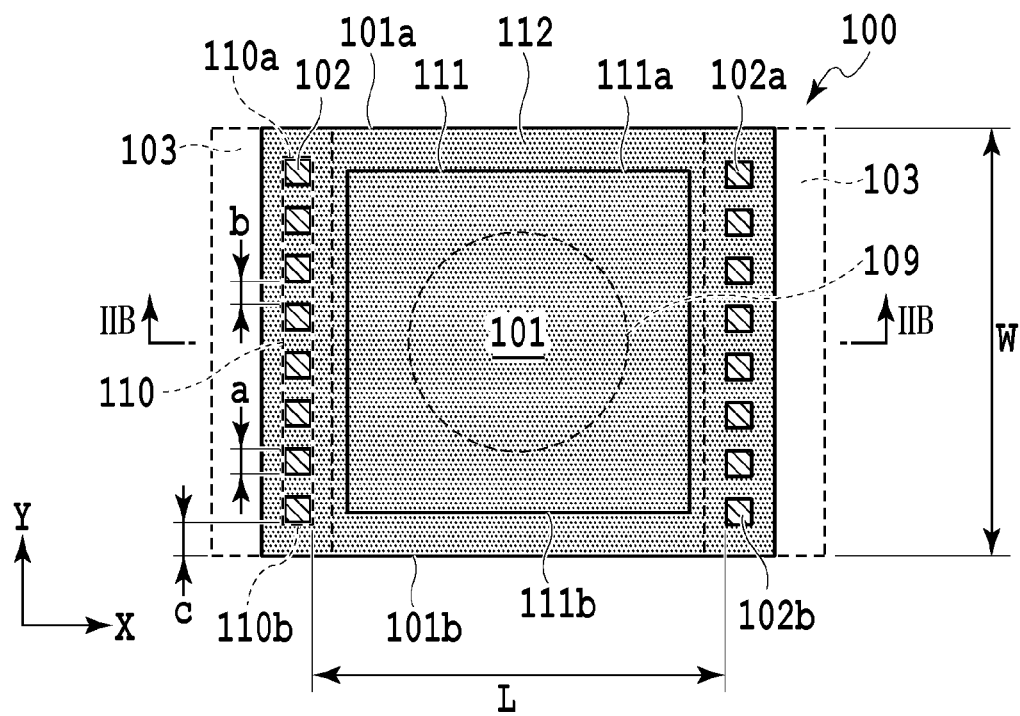
FIG. 2A illustrates the vicinity of a heating resistor element on an element board.
Figure 2B:
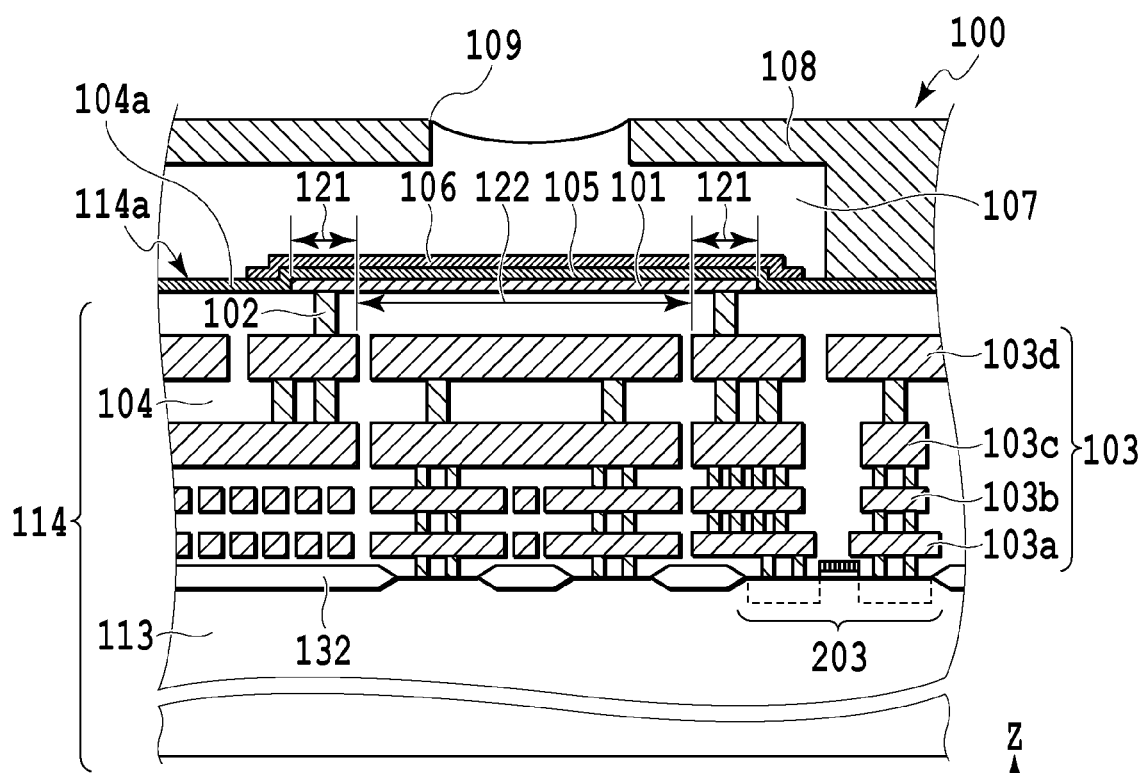
FIG. 2B illustrates the vicinity of a heating resistor element on an element board.

FIGS. 2A and 2B illustrate the vicinity of heating resistor elements in the element board 100, with FIG. 2A being a front view and FIG. 2B being a cross-sectional view taken along IIB-IIB of FIG. 2A. Note that an ejection port forming member 108 is omitted in FIG. 2A. The element board 100 has a board 114 and the ejection port forming member 108, the board 114 including a base material 113 made from Si and an insulation film 104 formed on the base material 113 and made from an insulator such as SiO. In addition, the insulation film 104 has provided thereon an electric wiring 103 to be used for supplying electric current to the heating resistor element 101, and the electric wiring 103 has electric wiring layers 103a, 103b, 103c and 103d. In addition, the board 114 has provided thereon the heating resistor element 101 that generates heat energy to eject liquid, a protecting film 105, and an anti-cavitation film 106.

The heating resistor element 101 is made from Ta compound such as TaSiN, the film thickness of the heating resistor element 101 (dimension in the direction of an arrow Z) is about 0.01-0.05 μm, which is much smaller than the thickness of the electric wiring 103 described below. An ejection port forming member 108 is provided on a surface 114a having formed thereon the heating resistor element 101 of the board 114, and the ejection port forming member 108, having an ejection port 109 corresponding to each of the heating resistor elements 101, forms a pressure chamber 107 for each ejection port 109 together with the board 114.

The element board 100 has a driving circuit 203 provided thereon, the driving circuit 203 allowing the heating resistor element 101 to be driven. The driving circuit 203, being connected to an after-mentioned electrode pad provided on one end of the board 114, generates driving current of the heating resistor element 101 in accordance with printing signal supplied from outside the liquid ejection head via the electrode pad. The electric wiring 103, being provided in a manner embedded in the insulation film 104, electrically connects the heating resistor element 101 and the driving circuit 203 via a connecting member 102. The electric wiring 103, being made from aluminum, has a film thickness (dimension in the direction of the arrow Z) of about 0.6-1.2 μm. Electric current supplied via the electric wiring 103 causes the heating resistor element 101 to generate heat, and the heating resistor element 101 whose temperature has risen high heats ink in the pressure chamber 107 to generate air bubbles. Printing is performed by the air bubbles causing ejection from the ejection port 109 of ink in the vicinity of the ejection port 109.

The heating resistor element 101 is covered with the protecting film 105, the protecting film 105 being made from SiN and having a film thickness of about 0.15-0.3 μm. Note that the protecting film 105 may be made from SiO or SiC. The protecting film 105 is covered with the anti-cavitation film 106, the anti-cavitation film 106 being made from Ta and having a film thickness of about 0.2-0.3 μm. Note that the anti-cavitation film 106 may be made from Ir or Ru, and may be formed by laminating a plurality of layers.

The insulation film 104 has provided therein a plurality of the connecting members 102 for connecting the electric wiring 103 and the heating resistor element 101. The plurality of the connecting members 102 extending in the direction of film thickness (direction of the arrow Z) are provided along the direction of an arrow Y in a manner spaced apart from each other. The connecting member 102 connects the electric wiring 103 and the heating resistor element 101 in the vicinity of both side-ends in the direction of an arrow X of the heating resistor element 101. Therefore, electric current flowing in the heating resistor element 101 flows along the direction of the arrow X. The heating resistor element 101 has, at both ends thereof connected to the connecting members 102, connection regions 110 to which the connecting members 102 are connected. Although the connecting member 102 is a plug extending in the direction of the arrow Z from the vicinity of the end of the electric wiring 103 and has an approximately square cross-section in the present embodiment, it may have rounded corners and take a shape other than a square such as a rectangle, a circle or an oval.

Although the connecting member 102 is made from tungsten, it may also be made from any of titanium, platinum, cobalt, nickel, molybdenum, tantalum and silicon, or a compound thereof. The connecting member 102 may be integrally formed with the electric wiring 103. In other words, the connecting member 102 may be integrally formed with the electric wiring 103 by cutting out a part of the electric wiring 103 in the thickness direction.

The electric wiring 103 is provided inside the insulation film 104 and connected to the heating resistor element 101 by the connecting member 102. Providing the heating resistor element 101 with electric connecting from the back side as described above makes the electric wiring that covers the front side of the heating resistor element 101 unnecessary. With the film thickness of the heating resistor element 101 being about 0.01-0.05 μm and the film thickness of the protecting film 105 being about 0.15-0.3 μm, a sufficient degree coverage may be secured. Thus, providing a relatively thin film thickness of the protecting film 105 improves the efficiency of heat transfer to ink. Accordingly, it is possible to realize both reduced power consumption, and high-resolution by stabilized foaming. In addition, improvement of patterning precision and reliability of the anti-cavitation film 106, and improvement of adhesiveness to the board 114 and processing precision of the ejection port forming member 108 may also be expected, which brings about merits in terms of production besides high-resolution.

The connection position of the connecting member 102 to the heating resistor element 101 defines the substantial length (effective length L) in the X-direction of the heating resistor element 101 (see FIG. 2A). The effective length L of the heating resistor element 101 is made equal to the space between the connection regions 110 at both sides in the direction of the arrow X, and raising the dimensional precision of the effective length L allows for raising the dimensional precision of the length in the direction of the arrow X of foaming region 111. In the present embodiment, a hole is formed on the flat insulation film 104 by dry etching, and the connecting member 102 is formed by embedding the material of the connecting member 102 in the hole. Dry etching is superior to wet etching in terms of fine processing and therefore it is possible to raise the dimensional precision for the effective length L, which is substantially defined by the space between the connecting members 102 at both ends of the heating resistor element 101, to be higher than a formation method using wet etching. In addition, the heating resistor element 101 may be formed by patterning thin film, and therefore it is also possible to raise the dimensional precision for the width W in the direction of the arrow Y of the heating resistor element 101.

Improvement of the dimensional precision of the heating resistor element 101 reduces the unevenness of foaming characteristics among the heating resistor elements 101. Accordingly, it is possible to raise the resolution of the ejection head 700, and also eliminate the necessity of excessively inputting energy in expectation of unevenness, which realizes reduced power consumption. In addition, it is possible to form a highly reliable heating resistor element since the configuration of the invention causes a film of the heating resistor element 101 to be formed on a flat underlying base even in the case where the connecting member 102 is directly connected to the electric wiring 103 from a hole without being embedded in the hole.

It is necessary to reduce foaming unevenness and resistance value unevenness to obtain more uniform ink ejection characteristics. Therefore, it is preferred that the underlying base (lower region) of the heating resistor element 101 is flat. In the configuration of the present invention, the underlying base part of the electric wiring 103 and the heating resistor element 101 of each layer are flattened by processing such as CMP (chemical mechanical polishing). Accordingly, the abutting plane of the connecting member 102 against the heating resistor element 101 and the abutting plane of the insulation film 104 against the heating resistor element 101 are provided on a same plane, as illustrated in FIG. 2B.

Thus, flattening of the underlying base (lower region) of the heating resistive layer makes it possible to pass an electric wiring 103 having a pattern such as a signal wiring or a power supply wiring directly under the heating resistor element 101, in other words, on the insulation film 104 between a center region 122 and the base material 113 and the periphery thereof. Furthermore, it becomes possible to provide transistors in the region, which results in a reduced area of the element board 100, allowing for low-cost liquid ejection heads and a higher density of the ejection port 109. In the present embodiment, as illustrated in FIG. 2B, the driving circuit 203 and a field oxidation film 132 are formed in an interface region with the insulation film 104 of the base material 113 made from Si.

The configuration described above allows for multi-layering of the electric wiring 103, while suppressing the effect on the characteristics of the heating resistor element 101. Thus, assigning a plurality of wiring layers to the electric wiring 103 allows for significantly reducing the power supply wiring resistance. In FIG. 2B, the electric wiring 103 includes four layers each having different distances from the heating resistive layer. The electric wiring layers 103a and 103b at the lower layer side are then assigned to the signal wiring layer and the logic wiring layer for driving the heating resistor element 101. In addition, the electric wiring layers 103c and 103d at the upper layer side (insulation film side) are assigned to the wiring layer for supplying electric current to the heating resistor element 101.

Figure 3:
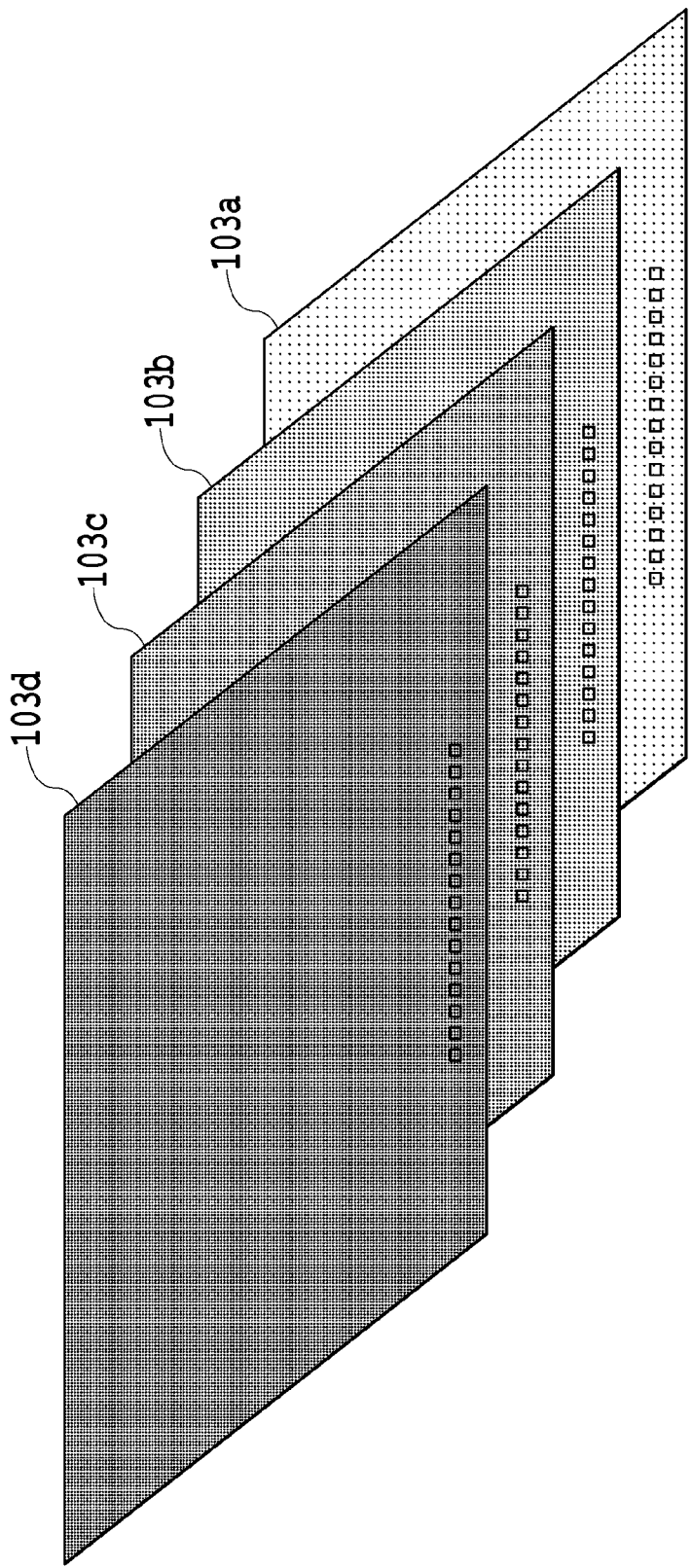
FIG. 3 illustrates an electric wiring on an element board.

FIG. 3 illustrates the electric wiring 103 on the element board 100. In the present embodiment, the electric wiring layer 103d is used as the ground (GNDH) wiring layer and the electric wiring 103c as the power supply (VH) wiring layer, with both the electric wiring layers 103c and 103d being so-called solid wirings, as illustrated in FIG. 3. In addition, the electric wiring layers 103c and 103d are respectively connected in common to all the heating resistor elements. Multi-layer wiring, with the electric wiring layer 103d and the wiring layer 103c of the power supply system being formed in different layers as described above, together with a configuration (solid wiring) of providing both electric wiring layers all over the surface of the element board, allows for significantly reducing the wiring resistance while suppressing enlargement of the element board 100.

In the present embodiment, the insulation film 104 has provided therein four electric wiring layers, namely, the electric wiring layers 103c and 103d that cause electric current to flow into the heating resistor element 101, and the electric wiring layers 103a and 103b as the signal wiring layer and the logic wiring layer for driving the heating resistor element. The electric wiring layers 103c and 103d are provided at the side closer to the heating resistor element 101 from the electric wiring layers 103a and 103b, and the film thickness of the electric wiring layers 103c and 103d is preferred to be relatively thicker, considering the efficiency. On the contrary, the electric wiring layers 103a and 103b are provided at the side closer to the driving circuit 203 from the electric wiring layers 103c and 103d, and the film thickness of the electric wiring layers 103a and 103b is preferred to be relatively thinner.

Figure 4A:
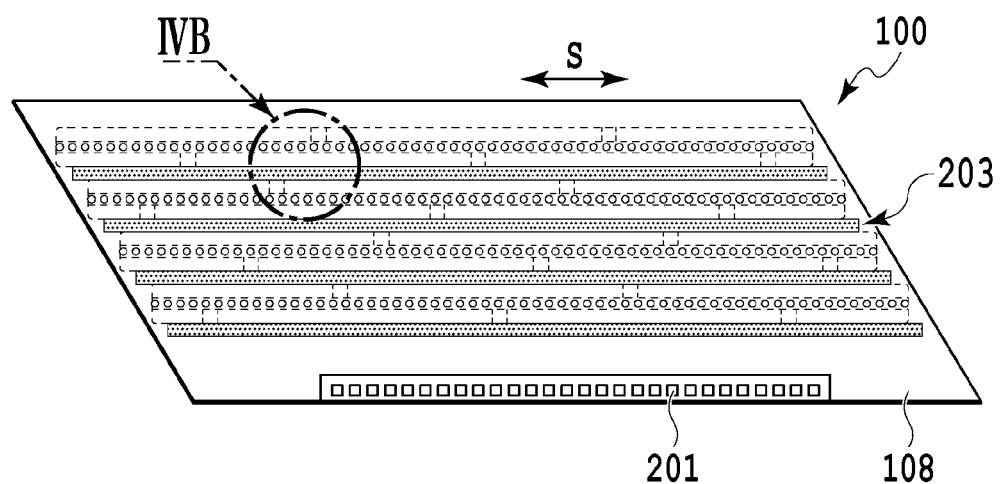
FIG. 4A illustrates an element board.
Figure 4B:
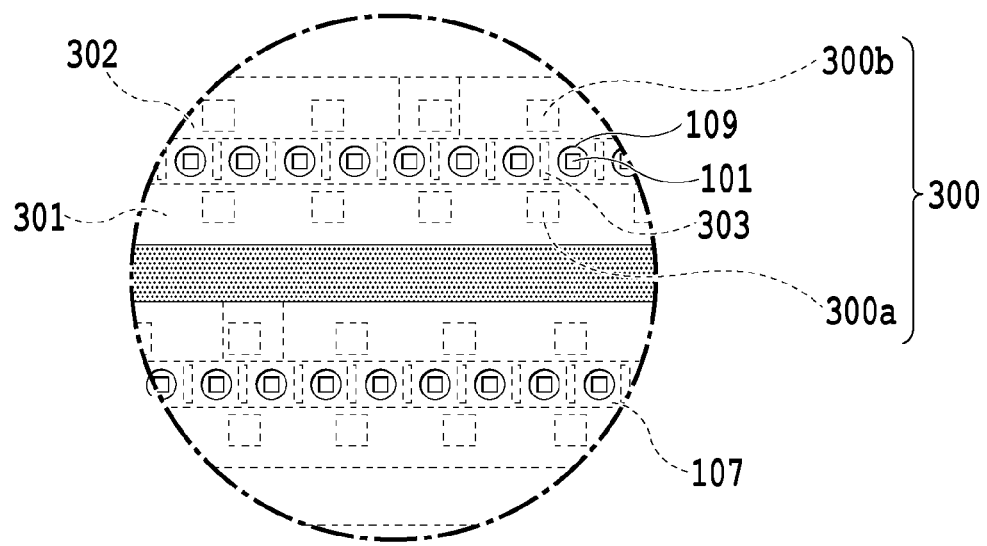
FIG. 4B illustrates a part of an element board in an enlarged manner.

FIG. 4A illustrates the element board 100, and FIG. 4B illustrates a part of the element board 100 in an enlarged manner. The element board 100 has independent ink supply ports 300 (300a and 300b) provided in the longitudinal direction at its central part, with the heating resistor elements 101 being respectively arranged in a column between the independent ink supply ports 300a and 300b. The pressure chamber 107 is in communication with the independent ink supply ports 300, whereby ink supplied from the independent ink supply ports 300 is introduced into the pressure chamber 107.

Figure 5A:
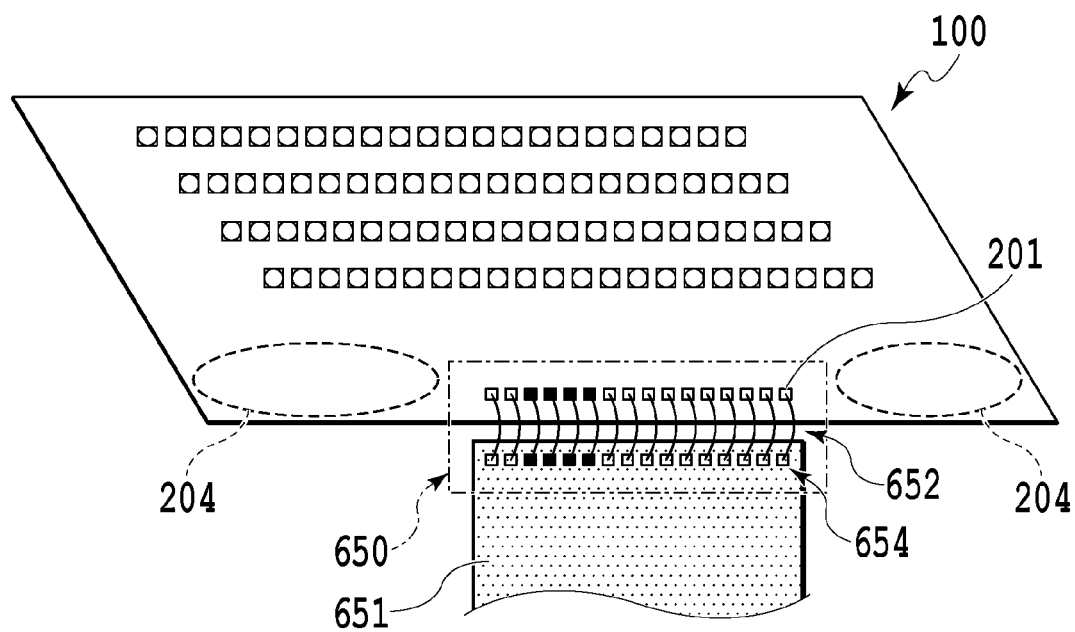
FIG. 5A illustrates an element board.
Figure 5B:
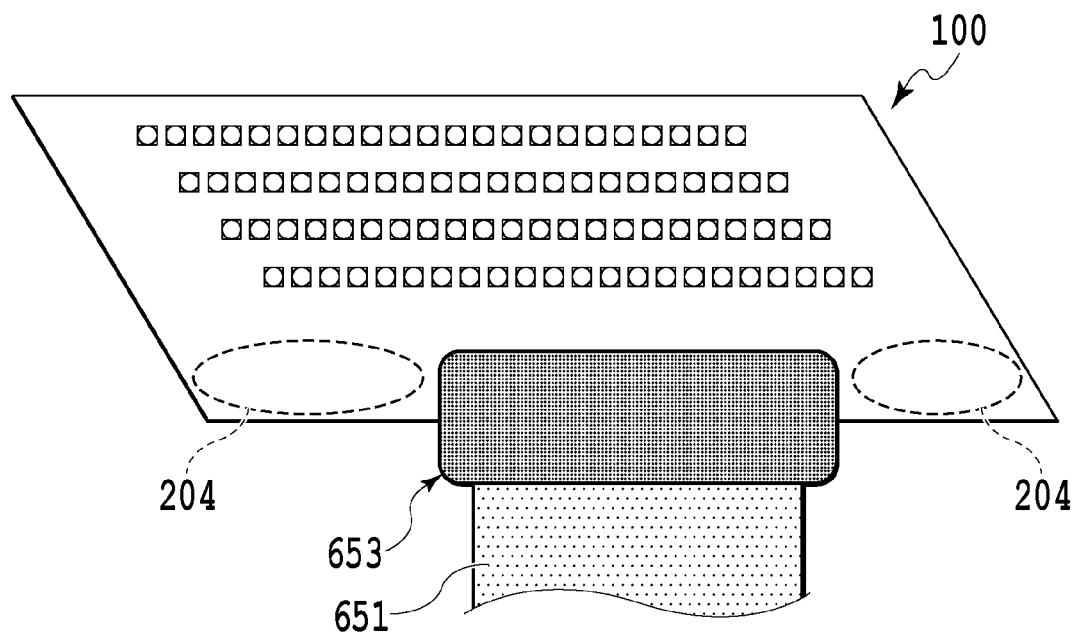
FIG. 5B illustrates the element board.

FIGS. 5A and 5B illustrate the element board 100, with FIG. 5A illustrating a connecting unit with a sealing material thereof being omitted, and FIG. 5B illustrating the connecting unit with a sealing material provided therein. A plurality of electrode pads 201 are arranged in a column (electrode terminal column) on one end along the longitudinal direction of the element board 100. Here, an electrode pad, which is meant to be an electrode provided on the element board with electrically conductive layers laminated thereon, is used as a connector for electric connection mainly to the outside (flexible cable, etc.). The connecting unit of the element board 100 includes the electrode pads 201 of the element board 100 being connected to electrode pads 654 of a flexible cable 651 by wire bonding 652. Covering the connecting unit with the water-repellent sealing material 653 so as to prevent contact with ink or the like suppresses occurrence of corrosion and raises the reliability of connection.

In addition, the electrode pads 201 of the element board 100 are provided from the right and the left ends in the longitudinal direction (direction of the arrangement of electrode pads) of the element board 100 in a manner spaced apart by a predetermined interval (700 μm or more in the present embodiment) so as to secure a sealing-prohibited region 204 in which sealing material is not coated. As has been explained in FIG. 1, the liquid ejection head 700 has a plurality of the element boards 100 provided adjacently in the longitudinal direction of the element boards 100. Providing a connecting unit all over the longitudinal direction of the element boards 100 and sealing the same with a sealing material without providing the sealing-prohibited region 204 may result in interference between the sealing material and one of the element boards 100 adjacent thereto, which may reduce the reliability of the mounting position of the element boards 100. Therefore, the present embodiment ensures the reliability of the mounting position of the element boards 100 by providing the sealing-prohibited region 204 at the both ends of the element boards 100 in the longitudinal direction without providing the electrode pads 201 at the both ends.

FIGS. 6A to 6D illustrate the element board 100 of the present embodiment. The electrode pads 201 provided on the element board 100 include a group of driving electrode pads 600 (power source terminal group). The group of driving electrode pads 600 has provided therein two or more electrode pads (power source terminals) adjacent to each other that supply the heating resistor element 101 with electric current (see FIG. 6A). The group of driving electrode pads 600 is to be used to transmit, to the heating resistor element 101 via an electric wiring layer, electric current to drive the heating resistor element 101. Each electrode pad of the group of driving electrode pads 600 is connected to the electric wiring layer 103c connected in common to all the heating resistor elements. Thus, arranging driving electrode pads adjacent to each other as a group allows for securing sufficient electric current capacity even in the case where the total amount of flowing electric current is larger when the heating resistor elements 101 are driven simultaneously. In addition, as illustrated in FIG. 6B, a similar effect can be obtained by selecting a shape of the driving electrode pad 602 with a larger area than that of the electrode pad 603 (electrode terminal) other than the electrode pad supplying electric current to the heating resistor element 101 (other than the power source terminal). Note that, the electrode pad 603 may be an electrode pad for transmitting a signal for driving the heating resistor element 101 to the element board 100.

In addition, providing the group of adjacent driving electrode pads 600 and the large-area driving electrode pad 602 allows for integrating the wirings within the flexible cable 651 to be connected thereto into a single thick wiring. Alternatively, the number of the wirings may be made smaller than the number of pads in the group of driving electrode pads 600. On the other hand, providing the driving electrode pad 599 in a distributed manner as illustrated in FIG. 6C causes wirings of the flexible cable to be provided respectively so as to be connected to respective pads 599, whereby the width of the flexible cable is widened as much as the space between adjacent wirings. Accordingly, providing the group of driving electrode pads 600 and the driving electrode pads 602 allows for narrowing the width of the flexible cable electrically connecting the element board 100 and the main body in comparison with the aforementioned case, and also cost reduction. Furthermore, providing only a minimum necessary group of driving electrode pads in which a large amount of electric current may flow and become a noise source allows for suppressing radiation noise as much as possible, which may lead to an improved reliability of adjacent electrical signals.

In the following, a characteristic configuration of the present embodiment will be described. The element board 100 of the present embodiment takes a point-symmetric parallelogram shape having a long edge and a short edge as illustrated in FIGS. 6A to 6D. Dividing the element board 100 by a perpendicular bisector of the long edge (a perpendicular bisector of columns of electrode pads) results in asymmetric shapes of one region and the other region. In addition, the shape of the element board 100 is a parallelogram such that, with regard to the two angles formed between the edge on which the electrode pads 201 are provided and the two edges connected to both ends of the former edge, the angle on the left side turns out to be larger than the angle on the right side in FIGS. 6A to 6D. That is, the left end of the side on which the electrode pads 201 are provided forms an obtuse angle, and its right end forms an acute angle. In the case where there are four columns of heating resistor elements (column A, column B, column C and column D) on the element board taking the aforementioned shape, the columns of heating resistor elements are provided in a manner gradually shifted leftward from column A to column D.

In the case where the element board is a parallelogram as in the present embodiment, the columns of heating resistor elements are provided in a manner gradually shifted leftward from column A to column D. Therefore, providing the group of driving electrode pads 600 at the central part of the columns of electrode pads results in a longer distance, from the group of driving electrode pads 600, of the heating resistor element 601 (first ejection element) on the left end of the columns of heating resistor elements located farthest from the group of driving electrode pads 600. In other words, distance of the heating resistor element 601 from the group of driving electrode pads 600 turns out to be longer than the heating resistor element 604 (second ejection elements) at the right end of the column of heating resistor elements located farthest from the group of driving electrode pads 600. Therefore, voltage drop that occurs at the distance to the heating resistor element 601 becomes large, whereby the difference from the voltage drop that occurs at the distance to a heating resistor element located close to the group of driving electrode pads 600 becomes large.

Figure 7A:
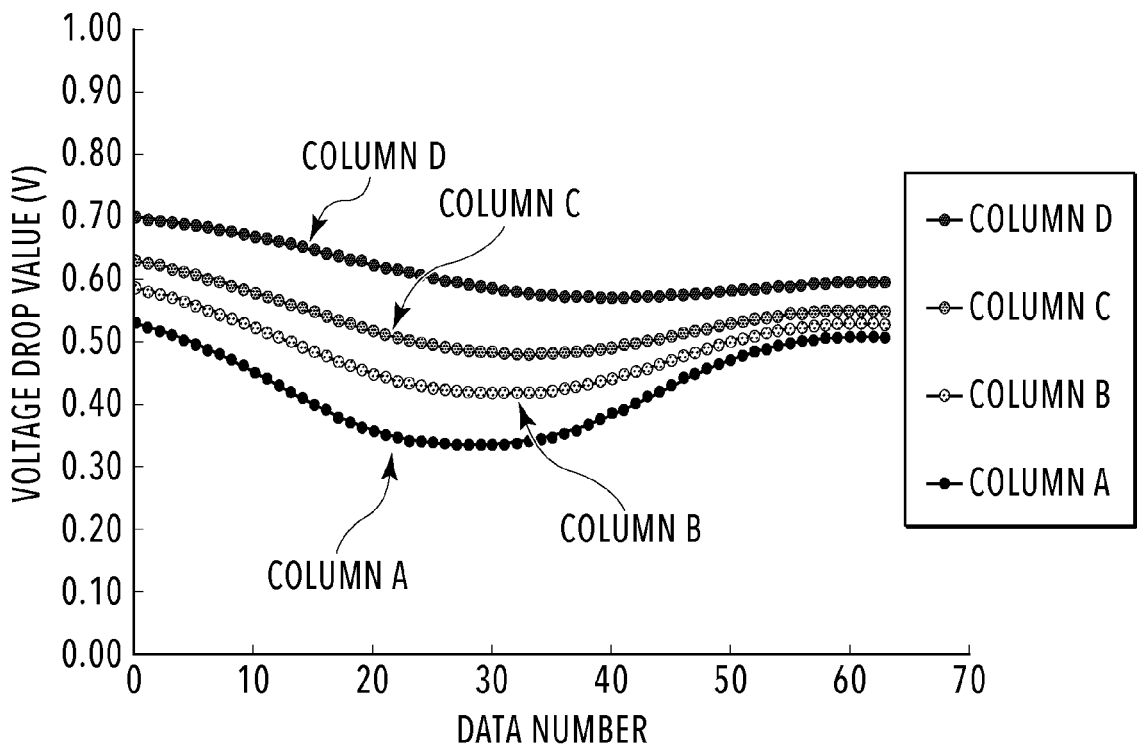
FIG. 7A is a graph representing a relation between voltage drop values and heating resistor element positions.
Figure 7B:
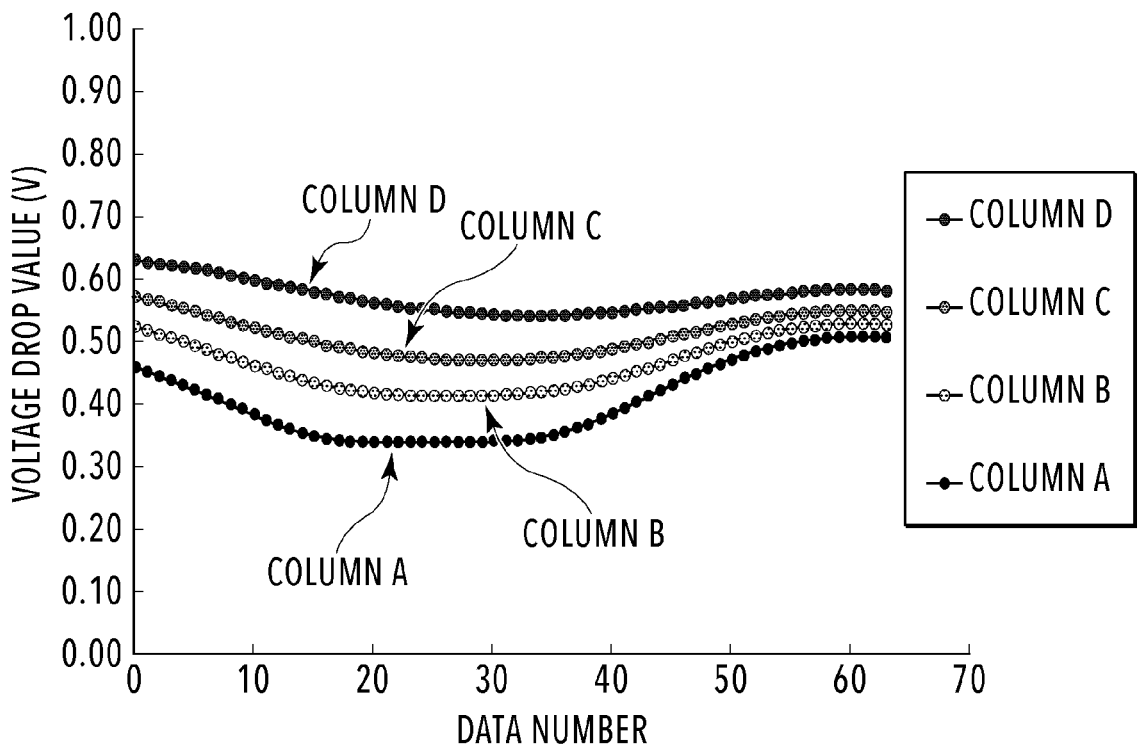
FIG. 7B is a graph representing a relation between voltage drop values and heating resistor element positions.

FIGS. 7A and 7B are graphs representing the relation between voltage drop values and heating resistor element positions when heating resistor elements in respective columns are simultaneously driven (64 elements in one column are simultaneously driven in the graphs). With regard to the data numbers in FIGS. 7A and 7B, zero is set as the data number of the heating resistor element on the left end in the column of heating resistor elements of FIGS. 6A to 6D. FIG. 7A is a graph in the case where the group of driving electrode pads 600 is located at the center of the column of electrode pads provided in a single column. It can be seen from FIG. 7A that the largest voltage drop occurs in the heating resistor element (heating resistor element 601 of FIG. 6A) on the left end of the column of heating resistor elements (column D) located farthest from the driving electrode pad. In addition, it can also be seen that there is a large difference between the points with the largest and the smallest voltage drops (central part of column A).

To stably drive heating resistor elements on the element board described above, it is necessary to preliminarily predict the amount of voltage that may drop in a heating resistor element that exhibits the largest voltage drop and apply voltage with the amount of voltage added thereto, when driving the heating resistor elements simultaneously. In such a case, however, a voltage equivalent to that of a heating resistor element at a position with the largest voltage drop is also added to a heating resistor element located at a position with a small voltage drop. Accordingly, it turns out that excessive voltage is supplied to the heating resistor element at a position with a small voltage drop, which may result in a worsened durability of the heating resistor elements.

Therefore, the element board 100 of the present embodiment has the group of driving electrode pads 600 provided thereon in a manner shifted from the center of the columns of electrode pads provided along the long edge of the element board 100 to the side of the heating resistor element located farthest from the group of driving electrode pads 600. In other words, the group of driving electrode pads 600 is provided in a manner shifted from the center of the columns of electrode pads so as to be provided closer to the heating resistor element (heating resistor element 601 of FIG. 6A) provided at a position located farthest from the group of driving electrode pads 600 and considered to exhibit the largest voltage drop due to wiring resistance. In this manner, it is possible to reduce the voltage drop for the heating resistor element 601 considered to be most affected by the voltage drop. Accordingly, it is possible to reduce the voltage for compensating the voltage drop.

FIG. 7B is a graph indicating a relation between voltage drop values and heating resistor element positions with the group of driving electrode pads 600 being shifted leftward from the center of the column of electrode pads arranged in a column. It can be seen that the amount of voltage drop in the heating resistor elements of all the columns (column A to column D) has been mitigated than the graph of FIG. 7A. It should be noted here that the value of the heating resistor element exhibiting the largest voltage drop (the heating resistor element 601 of FIG. 6A) has become small and, further, the difference between the positions exhibiting the largest and the smallest voltage drop has become small. The reason may be considered that the unevenness of the distance from the group of driving electrode pads 600 to respective heating resistor elements has become small and, as a result, the unevenness of voltage drop due to wiring resistance has decreased.

In the present embodiment, as has been described above, the group of driving electrode pads 600 is provided in a manner shifted leftward in the drawing from the center of the column of electrode pads. In other words, the group of driving electrode pads 600 is provided at the side where the heating resistor element located farthest from the group of driving electrode pads 600 (intersection of the long edge and the perpendicular bisector) exists, in a region which may be divided by the perpendicular bisector of the long edge of the element board 100 (a perpendicular bisector of columns of electrode pads). However, it is not advantageous to provide the group of driving electrode pads 600 at the leftmost end of an electrode pad column. It is because there is a possibility that the sealing may peel off during use and, in the case where the group of driving electrode pads 600 is provided at the endmost, ink may leak from where the sealing has peeled off to cause a short-circuit in the group of driving electrode pads 600 in which a large amount of electric current is flowing. Therefore, in consideration of safety, it is desirable to provide a low-voltage and low-electric-current electrode pad at the endmost of the column of electrode pads, and provide the group of driving electrode pads 600 to a position other than the end of the column of electrode terminals.

FIG. 6D illustrates the element board 100 having a plurality of groups of driving electrode pads 600 provided in the column of electrode pads. As illustrated in FIG. 6D, a plurality of groups of driving electrode pads 600 may be provided in the column of electrode pads. In such a case, it suffices that at least one or more groups of driving electrode pads 600 are provided leftward from the center of the column of electrode pads in the drawing. Further, the groups of driving electrode pads 600 and the driving electrode pads 602 having a large area are formed not only within a region (first region) in which the heating resistance elements are located furthest away from the intersection of the electrode pad column and its perpendicular bisector, but may also be arranged to extend over the other region (the second region). That is, at least one group of driving electrode pads 600 and at least one driving electrode pad 602 having a large area may be provided closer to the first region than to the second region.

Note that, although the case where the element board 100 has the shape of a parallelogram has been described, the present invention is not limited thereto. For example, assuming that the shape of the element board is rectangular, a similar problem also arises in the case where the column of electrode pads provided in proximity to an edge of the element board are located at one side from the center of the edge. In other words, providing the group of driving electrode pads 600 at the central part of the column of electrode pads on such an element board results in a large voltage drop of the heating resistor element located farthest from the group of driving electrode pads 600, and voltage drops of a plurality of heating resistor elements provided in the element board 100 become uneven. In the aforementioned case, similarly, it suffices to provide the group of driving electrode pads 600 in a manner shifted in the column of electrode pads toward the side of the region of the element board 100 where the heating resistor element located farthest from the intersection of the column of electrode pads and the perpendicular bisector thereof.

As has been described above, the group of driving electrode pads are provided in a manner shifted from the center of the column of electrode pads toward the side where the heating resistor element located farthest from the group of driving electrode pads exists. Accordingly, it has become possible to realize an element board, a liquid ejection head, and a printing apparatus capable of suppressing decrease of the durability of heating resistor elements.

Second Embodiment

In the following, a second embodiment of the present invention will be described, referring to the drawings. Since the basic configuration of the present embodiment is similar to that of the first embodiment, only characteristic components will be described below.

Figure 8:
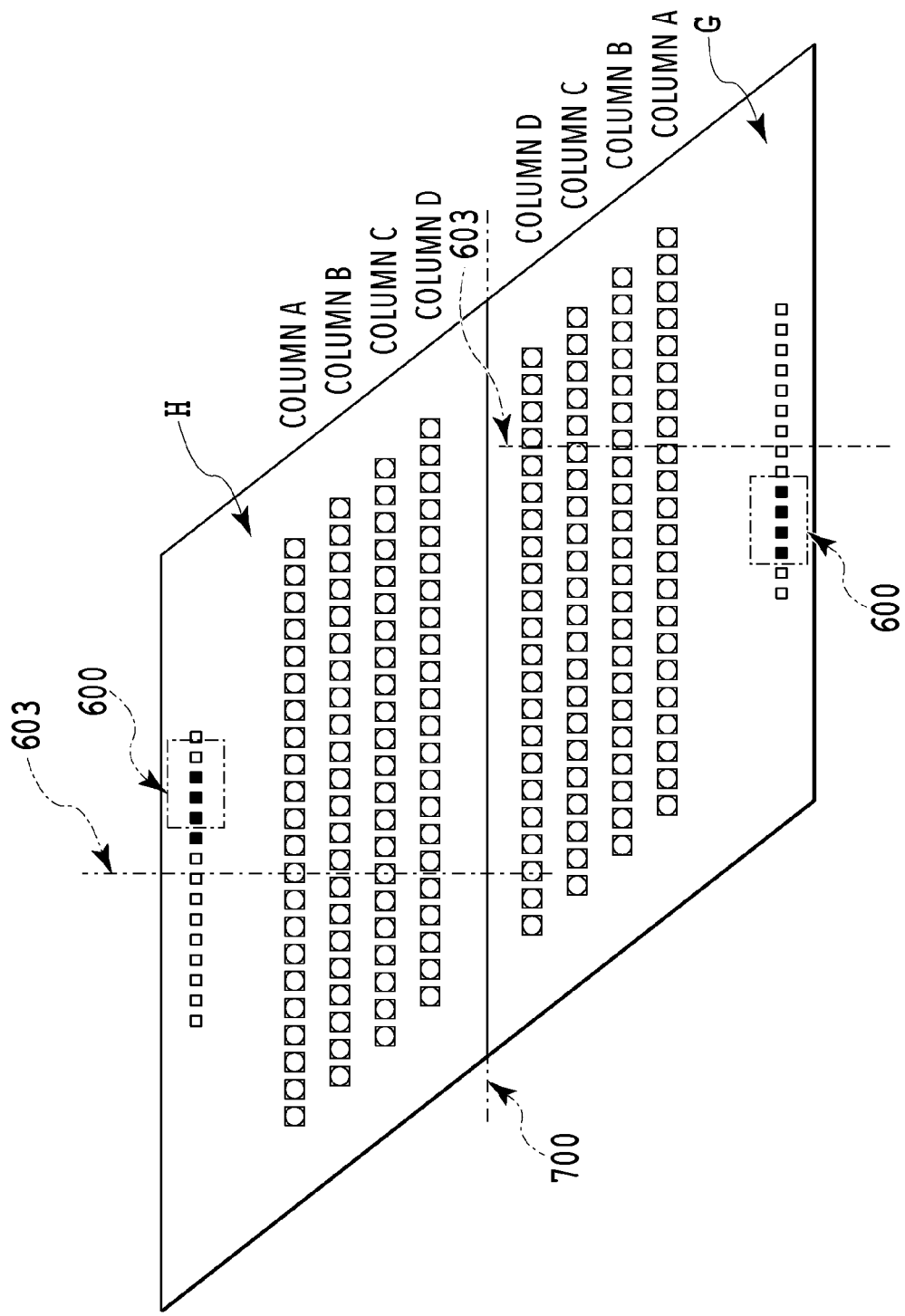
FIG. 8 illustrates the element board.

FIG. 8 illustrates element boards G and H in the second embodiment. In the present embodiment, the element boards are reversed and coupled. Subsequently, on the element board G, the group of driving electrode pads is shifted from the center of the column of electrode pads toward the side where the heating resistor element located farthest from the group of driving electrode pads exists. In addition, on the element board H, similarly to the element board G, the group of driving electrode pads is shifted from the center of the column of electrode pads toward the side where the heating resistor element located farthest from the group of driving electrode pads exists. Note that the element boards H and G are not electrically wire-connected in the aforementioned configuration.

As has been described above, element boards are coupled, and a group of driving electrode pads on respective element boards is shifted from the center of the column of electrode pads toward the side where the heating resistor element located farthest from the group of driving electrode pads exists. Accordingly, it has become possible to realize an element board, a liquid ejection head, and a printing apparatus capable of suppressing decrease of the durability of heating resistor elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-129196 filed Jun. 30, 2017, which is hereby incorporated by reference wherein in its entirety.

What is claimed is:

1. An element board having a surface comprising:
   a plurality of ejection elements to be used to eject liquid from ejection ports; and
   a column of electrode terminals provided in proximity to a predetermined edge and having a plurality of electrode terminals arranged along the edge, the column of electrode terminals including at least one group of power source terminals having a plurality of power source terminals provided adjacent to each other along the edge and connected to the plurality of ejection elements to supply electric current to the ejection elements, wherein
   the surface has a first region and a second region divided by a perpendicular bisector of the column of electrode terminals,
   the plurality of ejection elements in the first region include a first ejection element located farthest from an intersection of the column of electrode terminals and the perpendicular bisector,
   the plurality of ejection elements in the second region include a second ejection element located farthest from the intersection,
   a distance from the intersection to the first ejection element is longer than a distance from the intersection to the second ejection element, and
   the at least one group of power source terminals is provided closer to the first region than to the second region.

2. The element board according to claim 1, wherein the surface is asymmetric with regard to the perpendicular bisector being an axis.

3. The element board according to claim 2 having a shape of a parallelogram with a long edge and a short edge, the shape being point-symmetric.

4. The element board according to claim 3 comprising a plurality of the columns of electrode terminals including a first column of electrode terminals and a second column of electrode terminals, wherein
   the first column of electrode terminals has the plurality of electrode terminals provided along the edge, and
   the second column of electrode terminals has the plurality of electrode terminals provided along an edge facing the edge.

5. The element board according to claim 1, wherein the power source terminal is located at a position other than an end of the column of electrode terminals.

6. The element board according to claim 1, wherein the ejection elements are heaters, and pressure chambers configured to cause liquid to foam by heat of the ejection elements are provided in accordance with the ejection elements.

7. The element board according to claim 1, wherein the ejection elements are provided along the edge, in a manner forming a plurality of columns.

8. The element board according to claim 1 wherein
   a supply port configured to supply liquid is provided to the pressure chamber to be used to eject liquid by an action of the ejection element, and
   the ejection port, being in communication with the pressure chamber, is to eject liquid supplied from the supply port.

9. The element board according to claim 1, wherein the electrode terminals are provided in a manner spaced apart by a predetermined interval from a end of the element board in a direction of arrangement of the electrode terminals, connected to electrode terminals of other members, and sealed by a sealing material.

10. The element board according to claim 9, wherein the predetermined interval is 700 µm or more.

11. The element board according to claim 1, wherein wiring resistance from the intersection of the first ejection elements is larger than wiring resistance from the intersection of the second ejection elements.

12. A liquid ejection head including a plurality of element boards according to claim 1 arranged in a direction of the column of electrode terminals.

13. A printing apparatus configured to perform printing by ejecting liquid from the ejection head according to claim 12.

14. An element board having a surface comprising:
    a plurality of ejection elements to be used to eject liquid from ejection ports; and
    a column of electrode terminals provided in proximity to a predetermined edge and having electrode terminals arranged along the edge, the column of electrode terminals including at least one power source terminal connected to the plurality of ejection elements to supply electric current to the ejection elements, and terminals other than the power source terminal, the terminals having a shorter length than the power source terminal in a direction along the edge, wherein
    the surface has a first region and a second region divided by a perpendicular bisector of the column of electrode terminals,
    the plurality of ejection elements in the first region include a first ejection element located farthest from an intersection of the column of electrode terminals and the perpendicular bisector,
    the plurality of ejection elements in the second region include a second ejection element located farthest from the intersection,
    a distance from the intersection to the first ejection element is longer than a distance from the intersection to the second ejection element, and
    the at least one power source terminal is provided closer to the first region than to the second region.

15. The element board according to claim 14, wherein the surface is asymmetric with regard to the perpendicular bisector being an axis.

16. The element board according to claim 15 having a shape of a parallelogram with a long edge and a short edge, the shape being point-symmetric.

17. The element board according to claim 16 comprising a plurality of the columns of electrode terminals including a first column of electrode terminals and a second column of electrode terminals, wherein
    the first column of electrode terminals has the plurality of electrode terminals provided along the edge, and
    the second column of electrode terminals has the plurality of electrode terminals provided along an edge facing the edge.

18. The element board according to claim 14, wherein the power source terminal is located at a position other than an end of the column of electrode terminals.

* * * * *